United States Patent
Lee

(10) Patent No.: US 8,674,345 B2
(45) Date of Patent: Mar. 18, 2014

(54) ORGANIC LIGHT EMITTING DIODE DISPLAY AND MANUFACTURING METHOD THEREOF

(75) Inventor: Jung-Min Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 181 days.

(21) Appl. No.: 13/197,650

(22) Filed: Aug. 3, 2011

(65) Prior Publication Data

US 2012/0168779 A1    Jul. 5, 2012

(30) Foreign Application Priority Data

Dec. 30, 2010   (KR) .................. 10-2010-0139430

(51) Int. Cl.
*H01L 29/08* (2006.01)
*G09G 5/00* (2006.01)

(52) U.S. Cl.
USPC ............... 257/40; 257/59; 257/72; 257/88; 257/E51.001; 257/E51.018; 345/4; 345/5; 345/22; 345/55; 345/76

(58) Field of Classification Search
USPC ........... 257/40, 59, 72, 79, 88, 89, 90, 91, 94, 257/96, 99, 100, 678, 787, 788, 790, 791, 257/792, 793, 794, E51.001, E51.018, 257/E51.022, E33.001; 345/4, 5, 7, 22, 36, 345/44, 55, 76
See application file for complete search history.

(56) References Cited

U.S. PATENT DOCUMENTS

| | | | |
|---|---|---|---|
| 6,998,776 B2 | 2/2006 | Aitken et al. | |
| 7,537,504 B2 | 5/2009 | Becken et al. | |
| 2005/0244215 A1* | 11/2005 | Prat et al. | 403/268 |
| 2007/0075316 A1* | 4/2007 | Yamazaki et al. | 257/72 |
| 2011/0248292 A1* | 10/2011 | Park | 257/89 |
| 2012/0061131 A1* | 3/2012 | Lee et al. | 174/257 |
| 2012/0097987 A1* | 4/2012 | Ryu et al. | 257/88 |

FOREIGN PATENT DOCUMENTS

| | | |
|---|---|---|
| JP | 05-205876 A | 8/1993 |
| JP | 2001-210467 A | 8/2001 |
| KR | 10-2008-0088031 A | 10/2008 |

* cited by examiner

*Primary Examiner* — Cuong Q Nguyen
*Assistant Examiner* — Galina Yushina
(74) *Attorney, Agent, or Firm* — Christie, Parker & Hale, LLP

(57) ABSTRACT

An organic light emitting diode display includes: a substrate; a display device formed on the substrate, and including a common power line and a common electrode; a sealing substrate attached to the substrate by a junction layer surrounding the display device, the sealing substrate sealing the display device with the substrate; a first conductor formed over an outer side, a lateral side, and an inner side of the sealing substrate, the first conductor being for supplying a first electrical signal to the common power line; a second conductor formed on the inner side, the lateral side, and the outer side of the sealing substrate, the second conductor being for supplying a second electrical signal to the common electrode; and a plurality of arranging members formed into the sealing substrate, the first conductor, and the second conductor, the arranging members being for arranging positions of the sealing substrate, the first conductor, and the second conductor.

18 Claims, 13 Drawing Sheets

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2010-0139430, filed in the Korean Intellectual Property Office on Dec. 30, 2010, the entire content of which is incorporated herein by reference.

BACKGROUND

1. Field

The described technology relates generally to an organic light emitting diode (OLED) display and a manufacturing method thereof. More particularly, the described technology relates generally to an organic light emitting diode (OLED) display including a sealing substrate for sealing a display and a manufacturing method thereof.

2. Description of Related Art

An organic light emitting diode (OLED) display is a self-emissive display that displays an image with a self-emissive organic light emitting element. Since a display including a plurality of organic light emitting elements is deteriorated in function when being exposed to moisture and oxygen, external moisture and oxygen should be prevented or blocked from permeating through by sealing the display with a sealing substrate.

The above information disclosed in this Background section is only for enhancement of understanding of the background of the described technology and therefore it may contain information that does not form the prior art that is already known in this country to a person of ordinary skill in the art.

SUMMARY

An aspect of an embodiment of the present invention is directed toward an organic light emitting diode (OLED) display for increasing a sealing capability of a display, and a manufacturing method thereof.

An exemplary embodiment provides an organic light emitting diode display including: a substrate; a display device formed on the substrate, and including a common power line and a common electrode; a sealing substrate attached to the substrate by a junction layer surrounding the display device, the sealing substrate sealing the display device with the substrate; a first conductor formed over (on) an outer side, a lateral side, and an inner side of the sealing substrate, the first conductor being for supplying a first electrical signal to the common power line; a second conductor formed on the inner side, the lateral side, and the outer side of the sealing substrate, the second conductor being for supplying a second electrical signal to the common electrode; and a plurality of arranging members formed into the sealing substrate, the first conductor, and the second conductor, the arranging members being for arranging positions of the sealing substrate, the first conductor, and the second conductor.

In one embodiment, the first conductor includes a first center formed in the center of the outer side of the sealing substrate; and a plurality of first branches extended from the first center and formed over both the lateral side and the inner side of the sealing substrate.

In one embodiment, the second conductor includes a second center formed in the center of the inner side of the sealing substrate; and a plurality of second branches extended from the second center and formed on both the lateral side and the outer side of the sealing substrate.

In one embodiment, the first branches and the second branches are alternately disposed, and the first branches are separated from the second branches.

In one embodiment, the arranging members include: a first arranging hole for arranging positions of the sealing substrate and the first conductor; and a second arranging hole for arranging positions of the sealing substrate and the second conductor, and the position of the first arranging hole does not correspond to the position of the second arranging hole.

In one embodiment, the first arranging hole includes: a first sealing arranging hole formed into the sealing substrate; and a first conductive arranging hole formed into the first conductor, and the position of the first sealing arranging hole corresponds to the position of the first conductive arranging hole.

In one embodiment, the second arranging hole includes: a second sealing arranging hole formed into the sealing substrate; and a second conductive arranging hole formed into the second conductor, and the position of the second sealing arranging hole corresponds to the position of the second conductive arranging hole.

In one embodiment, the first conductive arranging hole is formed into the first branch of the first conductor, and the second conductive arranging hole is formed into the second branch of the second conductor.

In one embodiment, the sealing substrate is made of a polymer and/or a glass fiber, and the thickness of the sealing substrate is equal to or greater than 50 μm and equal to or less than 100 μm.

In one embodiment, the sealing substrate is made of a resin matrix and a plurality of carbon fibers, and the thickness of the sealing substrate is equal to or greater than 100 μm and equal to or less than 200 μm.

In one embodiment, the sealing substrate is made of a resin matrix and carbon fibers, and the thickness of the sealing substrate is equal to or greater than 200 μm and equal to or less than 2 mm.

In one embodiment, the organic light emitting diode display further includes an insulating layer formed on the inner side, the outer side, and the lateral side of the sealing substrate, and the first conductor and the second conductor are provided on the insulating layer.

In one embodiment, the insulating layer formed on positions that correspond to the first branch and the second branch is wider than the first branch and the second branch.

In one embodiment, the first conductor and the second conductor are formed by an aluminum layer, an aluminum alloy layer, a copper layer, or a copper alloy layer.

Another embodiment provides a method for manufacturing an organic light emitting diode display including: (a) forming a display device including a common power line and a common electrode on a substrate; (b) forming a first conductor for supplying a first electrical signal to the common power line and a second conductor for supplying a second electrical signal to the common electrode on a sealing substrate for sealing the display device with the substrate; and (c) sealing the substrate by attaching the sealing substrate to the substrate. The method part (b) includes: providing a first conductive plate on the sealing substrate, and forming a first arranging hole on the same position as the sealing substrate and the first conductive plate; providing a second conductive plate below the sealing substrate, and forming a second arranging hole on the same position of the sealing substrate and the second conductive plate; cutting the first conductive plate into a first conductor including a first center and a first branch, and cutting the second conductive plate into a second conductor including a second center and a second branch; attaching the first conductor to an outer side of the sealing substrate with reference to the first arranging hole, and folding the first branch to attach it to a lateral side and an inner side of the sealing substrate; and attaching the second conductor to the inner side of the sealing substrate with reference to the second arranging hole, and folding the second branch to attach it to the lateral side and the outer side of the sealing substrate.

In one embodiment, the position of the first arranging hole does not correspond to the position of the second arranging hole.

In one embodiment, the first branch and the second branch are alternately disposed.

The organic light emitting diode (OLED) display according to the exemplary embodiment folds the first branch to connect the first outer layer and the first inner layer and folds the second branch to connect the second outer layer and the second inner layer without forming a via hole. Therefore, product cost and manufacturing processes are reduced because manufacturing processes such as hole drilling for forming the via hole, plugging, plating, or sanding are not needed.

Further, the first conductor and the second conductor can be arranged without an additional cost or device by forming the first arranging hole on the sealing substrate and the first conductor; and forming the second arranging hole on the sealing substrate and the second conductor.

DETAILED DESCRIPTION

Figure 1:
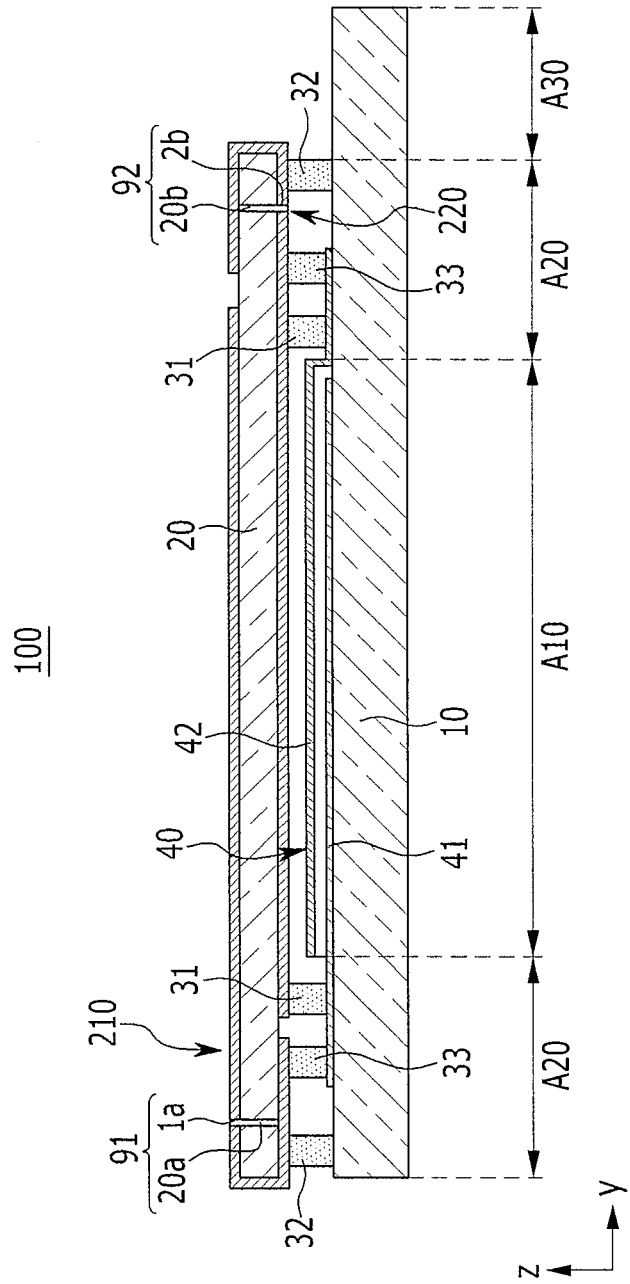
FIG. 1 shows a cross-sectional view of an organic light emitting diode (OLED) display according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. The size and thickness of the components shown in the drawings are optionally determined for better understanding and ease of description, and the present invention is not limited to the examples shown in the drawings.

It is to be understood that when an element such as a layer, film, region, or substrate is referred to as being "on" another element, it can be directly on the other element or one or more intervening elements may also be present.

FIG. 1 shows a cross-sectional view of an organic light emitting diode (OLED) display according to an exemplary embodiment.

Referring to FIG. 1, the organic light emitting diode (OLED) display 100 includes a substrate 10, a display device (unit) 40 formed on the substrate 10, and a sealing substrate 20 fixed on the substrate 10 by junction layers 31 and 32 surrounding (or surrounding a major portion of) the display device 40. The substrate 10 includes a display area A10 for displaying an image and a non-display area provided outside the display area A10. The non-display area includes a wire and sealing region A20 and a pad region A30.

An organic light emitting element and a driving circuit are formed on the display device 40 for each pixel. The organic light emitting element includes a pixel electrode, an organic emission layer, and a common electrode 42. The driving circuit includes at least two thin film transistors including a switching thin film transistor and a driving thin film transistor, and at least one capacitor.

Also, a gate line, a data line, and a common power line 41 are provided for each pixel. The gate line transmits a scan signal, and the data line transmits a data signal. The common power line 41 applies a common voltage to the driving thin film transistor. The common power line 41 is formed in parallel with the data line, or it includes a first common power line in parallel with the data line and a second common power line in parallel with the gate line.

A detailed configuration of the display device 40 will be described later, and FIG. 1 shows that the display device 40 includes the common power line 41 and the common electrode 42.

The junction layers 31 and 32 include a first junction layer 31 surrounding the display device 40, and a second junction layer 32 provided on the outer part defined by the first junction layer 31. A conductive junction layer 33 is provided between the first junction layer 31 and the second junction layer 32. The first junction layer 31 and the second junction layer 32 include non-conducting (insulating) material and include a thermosetting resin, for example, an epoxy resin. A hygroscopic filler is positioned inside the region defined by the substrate 10, the sealing substrate 20, and the first junction layer 31.

The common power line 41 and the common electrode 42 are not connected to a flexible printed circuit attached to the pad region A30. Instead, as shown in FIG. 1, the common power line 41 is connected to a first conductor 210 formed on the sealing substrate 20 to receive a first electric signal therefrom, and the common electrode 42 is connected to a second conductor 220 formed on the sealing substrate 20 to receive a second electric signal therefrom.

Therefore, the organic light emitting diode (OLED) display 100 according to the first exemplary embodiment can apply a uniform electric signal to the common power line 41 and the common electrode 42 without forming pad regions A30 on the four edges of the substrate 10. As a result, the entire structure of the organic light emitting diode (OLED) display 100 and the manufacturing process thereof can be simplified while preventing non-uniform luminance caused by a large area product. Therefore, the product cost is reduced.

Figure 2:
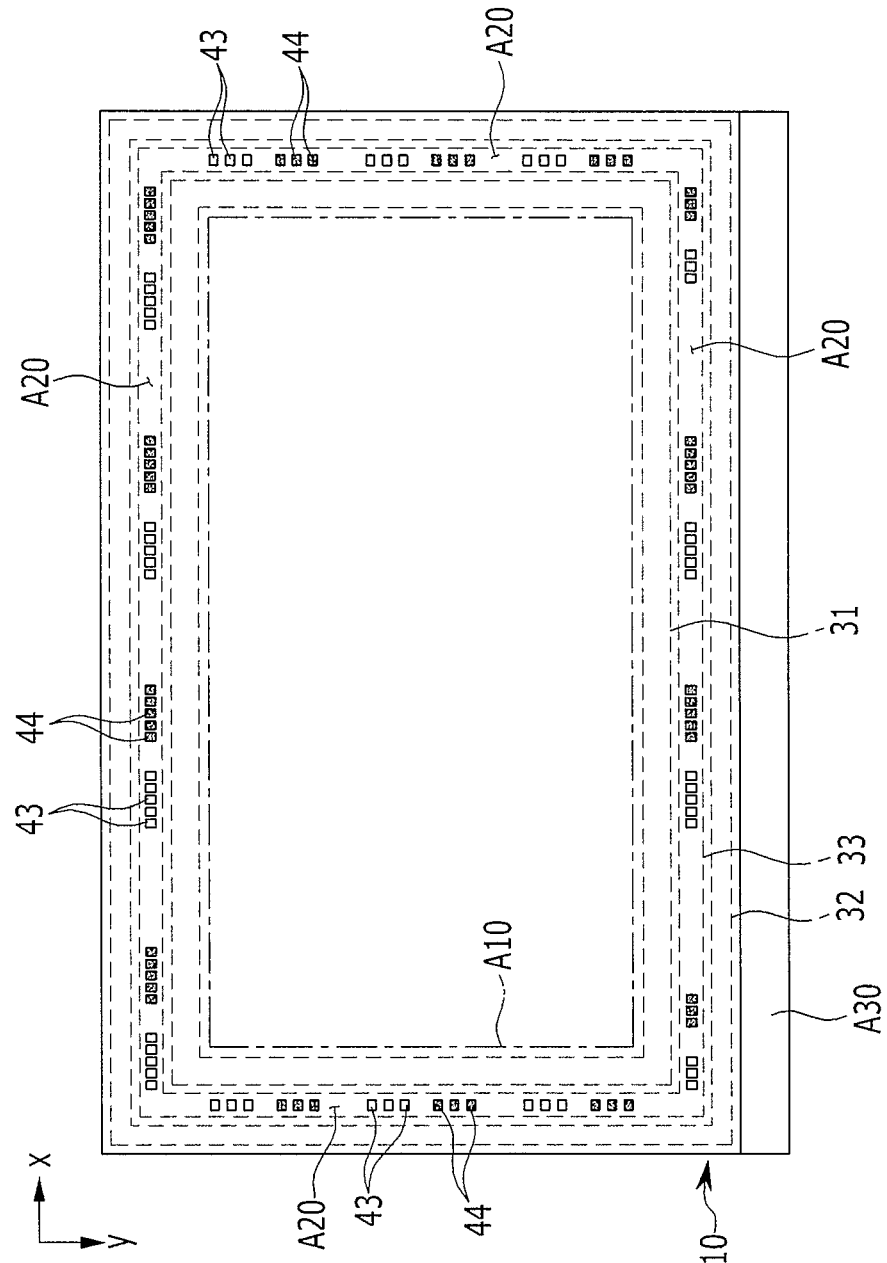
FIG. 2 shows a top plan view of a substrate in an organic light emitting diode (OLED) display shown in FIG. 1.

FIG. 2 shows a top plan view of a substrate in an organic light emitting diode (OLED) display shown in FIG. 1.

Referring to FIG. 1 and FIG. 2, the substrate 10 has a rectangular shape with a pair of long sides and a pair of short sides, and a wire and sealing region A20 is provided on the outer part at the four edges of the display device 40. The first junction layer 31, the conductive junction layer 33, and the second junction layer 32 are provided in the wire and sealing region A20.

The pad region A30 is provided at one edge of the substrate 10, that is, provided on the outer part defined by the wire and sealing region A20. FIG. 2 shows the pad region A30 provided on the bottom long side of the substrate 10, and the position of the pad region A30 is not restricted thereto.

A first pad 43 connected to the common power line 41 of the display 40 and a second pad 44 connected to the common electrode 42 of the display 40 are formed in the wire and sealing region A20. The first pad 43 and the second pad 44 are formed on four sides of the wire and sealing region A20, and are alternately disposed in the horizontal direction (x axis direction in the drawing) and the vertical direction (y axis direction in the drawing) of the substrate 10.

FIG. 2 shows the second pad 44 in a dot pattern so as to distinguish the first pad 43 and the second pad 44. From among the plurality of first pads 43, the first pads 43 provided at the long side of the substrate 10 are electrically connected to the first common power line, and the first pads 43 provided at the short side of the substrate 10 are electrically connected to the second common power line. The first pads 43 and the second pads 44 shown in FIG. 2 are simplified, and the positions and the number thereof are not restricted to the embodiment.

The first pad 43 and the second pad 44 are formed at a position that corresponds to the conductive junction layer 33 in the wire and sealing region A20. In this instance, the conductive junction layer 33 shows conductivity in the thickness direction (z axis direction into the drawing), and shows no conductivity in other directions. Accordingly, the first pad 43 and the second pad 44 are not short-circuited when one conductive junction layer 33 contacts the first pad 43 and the second pad 44.

Hence, the conductive junction layer 33 is not formed with the first pad 43 and the second pad 44, but it can be made with a single member. In this case, the organic light emitting diode (OLED) display 100 can be easily manufactured because the process for assembling the substrate 10 and the sealing substrate 20, using the first and second junction layers 31 and 32 and the conductive junction layer 33, can be simplified.

Figure 3:
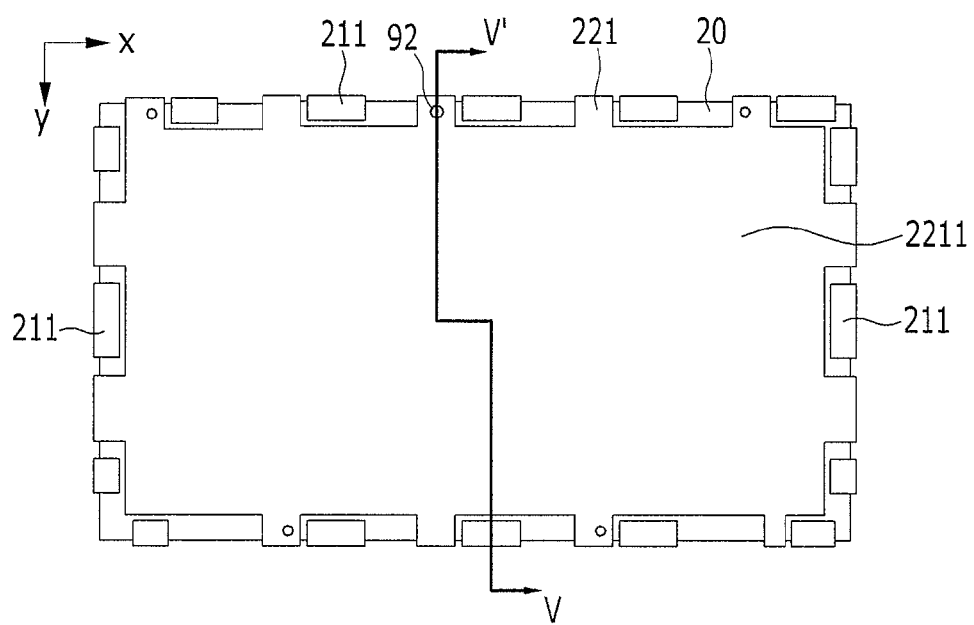
FIG. 3 shows a top plan view of an inner side of a sealing substrate in an organic light emitting diode (OLED) display shown in FIG. 1.
Figure 4:
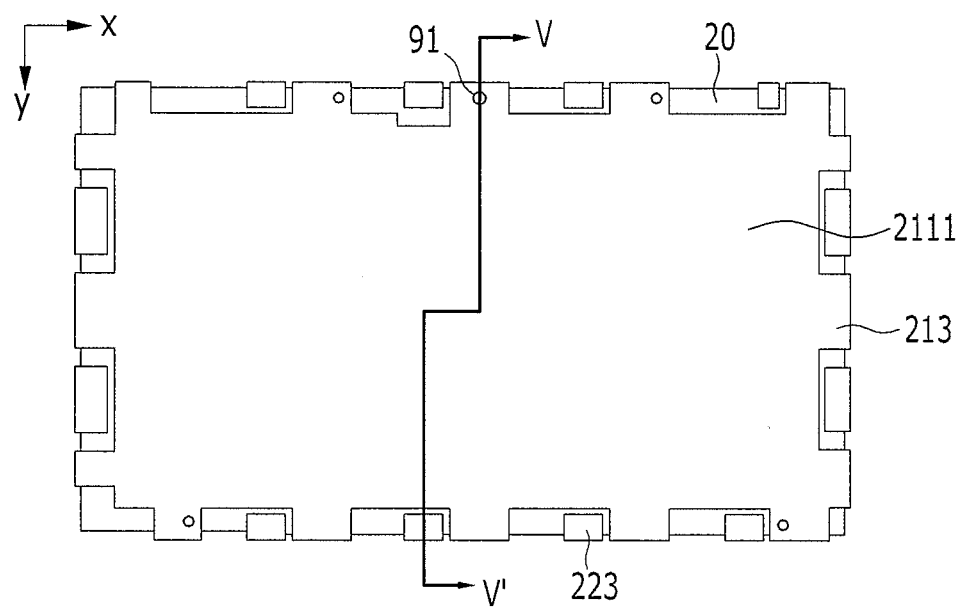
FIG. 4 shows a top plan view of an outer side of a sealing substrate in an organic light emitting diode (OLED) display shown in FIG. 1.
Figure 5:
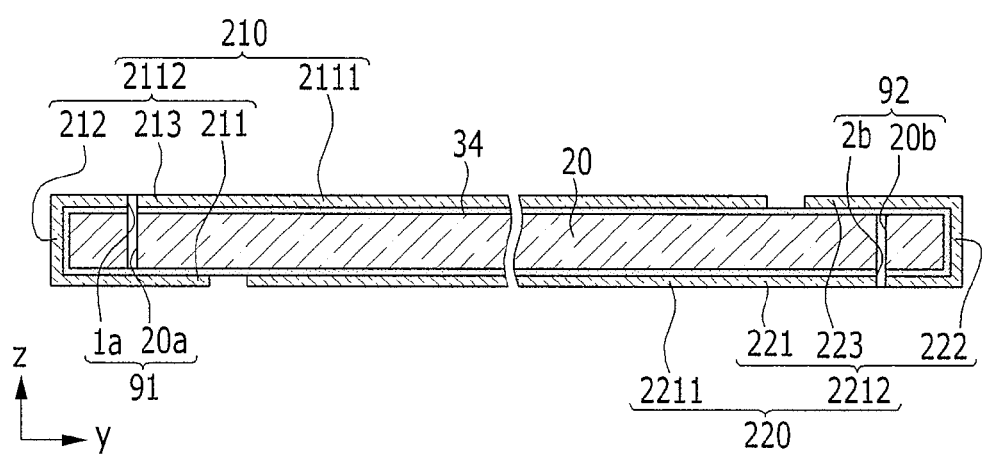
FIG. 5 shows a cross-sectional view with respect to a line V-V' of FIG. 4.

FIG. 3 and FIG. 4 respectively show top plan views of inner side/outer sides of a sealing substrate in an organic light emitting diode (OLED) display shown in FIG. 1, and FIG. 5 shows a cross-sectional view with respect to a line V-V' of FIG. 4.

Referring to FIG. 1 through FIG. 5, the sealing substrate 20 is formed to cover the display area A10 of the substrate 10 and four wire and sealing regions A20. Therefore, the pad region A30 of the substrate 10 is not overlapped on the sealing substrate 20 and is exposed to the outside.

The sealing substrate 20 includes an inner side facing the substrate 10, an outer side facing oppositely away from the inner side, and a lateral side for connecting the inner side and the outer side. The first conductor 210 for applying a first electric signal of the common power line 41 is formed through the inner side, the lateral side, and the outer side of the sealing substrate 20; and the second conductor 220 for applying a second electric signal of the common electrode 42 is formed over the inner side, the lateral side, and the outer side of the sealing substrate 20, and separated from the first conductor 210.

The first conductor 210 includes a first center 2111 formed in the center of the outer side of the sealing substrate 20; and a plurality of first branches 2112 extended from the first center 2111 and formed over the edges of the lateral side and the inner side of the sealing substrate 20. The first branch 2112 includes a first outer layer 213 extended from the first center 2111 and provided on the periphery of the outer side of the sealing substrate 20; a first connecting layer 212 contacting the first outer layer 213 and provided on the lateral side of the sealing substrate 20; and a first inner layer 211 contacting the first connecting layer 212 and provided on the periphery of the inner side of the sealing substrate 20.

The second conductor 220 includes a second center 2211 formed in the center of the inner side of the sealing substrate 20; and a plurality of second branches 2212 extended from the second center 2211 and formed over the edges of the lateral side and the outer side of the sealing substrate 20. The second branch 2212 includes a second inner layer 221 extended from the second center 2211 and provided on the periphery of the inner side of the sealing substrate 20; a second connecting layer 222 contacting the second inner layer 221 and provided on the lateral side of the sealing substrate 20; and a second outer layer 223 contacting the second connecting layer 222 and provided on the periphery of the outer side of the sealing substrate 20. The first conductor 210 and the second conductor 220 are formed with a conducting material.

The first branch 2112 and the second branch 2212 are separated and alternately disposed with each other so they are not short-circuited with each other.

The second center 2211 covers the display device 40, and is formed to be greater than or equal to the area surrounded by the first junction layer 31 and less than the area surrounded by the conductive junction layer 33. The second inner layer 221 extended from the second center 2211 faces the second pad 44 of the substrate 10 so that the second inner layer 221 contacts the conductive junction layer 33. Hence, the second pad 44 of the substrate 10 is electrically connected to the second center 2211 through the conductive junction layer 33 and the second inner layer 221.

The first conductor 210 and the second conductor 220 can be formed with a metal layer with low resistance and excellent protection against moisture and oxygen, for example, an aluminum layer, an aluminum alloy layer, a copper layer, or a copper alloy layer. From among the elements of the second conductor 220, the second center 2211 is tightly attached to the first junction layer 31 to cover and protect the display 40 inside the first junction layer 31 and block permeation of external moisture and oxygen. Therefore, the second center 2211 functions as a metal encapsulator for sealing the display 40.

From among the elements of the first conductor 210, the first inner layer 211 is formed to face the first pad 43 of the substrate 10 between the second inner layers 221 and contacts the conductive junction layer 33. The first inner layer 211 is divided into plural layers which are extended to the edge of the sealing substrate 20 and contact the first connecting layer 212 formed on the lateral side of the sealing substrate 20. Hence, the first pad 43 of the substrate 10 is electrically connected to the first inner layer 211 and the first connecting layer 212 through the conductive junction layer 33.

The first outer layer 213 and the second outer layer 223 are formed on the edge of the sealing substrate 20 with a gap therebetween. The first outer layer 213 is formed to be overlapped on the first inner layer 211, and the second outer layer 223 is formed to be overlapped on the second inner layer 221.

An external access terminal is attached to the first outer layer 213 and the second outer layer 223. Accordingly, the first outer layer 213 receives the first electric signal of the common power line 41 from the external access terminal and transmits the same to the first inner layer 211, and the second outer layer 223 receives the second electric signal of the common electrode 42 from the external access terminal and transmits the same to the second inner layer 221.

In both cases, the first inner layer 211 and the second inner layer 221 have the same thickness, and the first outer layer 213 and the second outer layer 223 are formed to have the same thickness in order to prevent generation of steps in the process for bonding the substrate 10 and the sealing substrate 20. This formation is usably applicable to the wide organic light emitting diode (OLED) display with a large current capacity while not increasing the outer size of the display device 40.

The first center 2111, the first inner layer 211, the first connecting layer 212, and the first outer layer 213 configuring the first conductor 210 can be integrally formed. Also, the second center 2211, the second inner layer 221, the second connecting layer 222, and the second outer layer 223 configuring the second conductor 220 can be integrally formed.

For example, the first conductor 210 and the second conductor 220 can be formed by providing metal foils with excellent flexibility such as an aluminum foil or a copper foil and attaching the metal foil over the inner side, the lateral side, and the outer side of the sealing substrate 20.

The sealing substrate 20 includes a carbon composite including a resin matrix and a plurality of carbon fibers. In the organic light emitting diode (OLED) display 100, a glass or polymer resin with a lesser thermal expansion coefficient is used for the substrate 10 because the substrate 10 must undergo a heat treatment process for forming the driving circuit and the organic light emitting elements thereon several tens of times. The sealing substrate 20 can have a lesser thermal expansion coefficient that is similar to the thermal expansion coefficient of the substrate 10 by controlling the content of the carbon fibers, the content of the resin matrix, and the thickness. In this instance, the thickness of the sealing substrate 20 can be equal or greater than 200 μm and equal or less than 2 mm. In one embodiment, when the thickness of the sealing substrate 20 is less than 200 μm; it is difficult to match the thermal expansion coefficient of the substrate 10. In another embodiment, when the thickness of the sealing substrate 20 is greater than 2 mm, it is difficult to manufacture a thin organic light emitting diode (OLED) display.

Therefore, when the first and second junction layers 31 and 32 and the conductive junction layer 33 are all hardened at a high temperature to bond the substrate 10 and the sealing substrate 20, no bending problem caused by the difference between the thermal expansion coefficients of the two substrates 10 and 20 occurs, and no bending problem occurs in the condition reliability test after they are bent. The sealing substrate 20 manufactured with the carbon composite has conductivity. When the first conductor 210 and the second conductor 220 are directly formed on the surface of the sealing substrate 20, the first conductor 210 and the second conductor 220 are short circuited through the sealing substrate 20. Therefore, as shown in FIG. 5, an insulating layer 34 is formed on the inner side, the lateral side, and the outer side of the sealing substrate 20, and the first conductor 210 and the second conductor 220 are formed on the insulating layer 34 to thus prevent the first conductor 210 and the second conductor 220 from being short circuited. The insulating layer 34 can be formed by using an insulating adhesive for adhering the first conductor 210, the second conductor 220, and the sealing substrate 20. The thickness of the insulating layer 34 can be equal to or greater than 20 μm and equal to or less than 40 μm.

In one embodiment, when the thickness of the insulating layer 34 is equal to or less than 20 μm, the first conductor 210, the second conductor 220, and the sealing substrate 20 can be electrically connected with each other. In another embodiment, when the thickness of the insulating layer 34 is greater than 40 μm, the substrate 20 may be bent by the thermal expansion coefficient of the insulating layer 34.

The insulating layer 34 formed on the position that corresponds to the first branch 2112 and the second branch 2212 may be wider than the first branch 2112 and the second branch 2212 so that the insulating layer 34 may prevent (or protect from) the short circuit of the first branch 2112 with the sealing substrate 20 and/or the short circuit of the second branch 2212 with the sealing substrate 20.

In the case of manufacturing a flexible and thin organic light emitting diode (OLED) display, it is possible to acquire flexibility by controlling the thickness of the sealing substrate 20 made of a carbon composite to be equal to or greater than 100 μm and equal to or less than 200 μm. Here, the sealing substrate 20 has a thermal expansion coefficient of $5 \times 10^{-6}$/K to $7 \times 10^{-6}$/K that is a little greater than that of the substrate 10 made of glass.

Further, in order to manufacture thinner and more flexible organic light emitting diode (OLED) display, it is possible to manufacture the sealing substrate 20 with polymers (PI, PET, PEN, PC) and/or glass fibers (Glass-Epoxy Prepreg, G10/FR4, CEM-3, CEM-4). The polymers and/or the glass fibers are insulating materials so no additional insulating layer for insulating the first conductor 210 and the second conductor 220 is needed. Also, the thickness of the sealing substrate 20 including the polymers or the glass fibers can be equal to or greater than 50 μm and equal to or less than 100 μm. In one embodiment, when the thickness of the sealing substrate 20 is less than 50 μm, the sealing substrate 20 does not have rigidity. In another embodiment, when the thickness of the sealing substrate 20 is greater than 100 μm, the problem caused by the great thermal expansion coefficient from $40 \times 10^{-6}$/K to $100 \times 10^{-6}$/K of the polymer and/or the glass fiber occurs. That is, the two substrates 10 and 20 are bent and/or wrinkled.

A plurality of arranging members 91 and 92 for arranging the positions of the sealing substrate 20, the first conductor 210, and the second conductor 220 are formed on the sealing substrate 20, the first conductor 210, and the second conductor 220.

The arranging members 91 and 92 include a first arranging hole 91 for arranging the positions of the sealing substrate 20 and the first conductor 210, and a second arranging hole 92 for arranging the positions of the sealing substrate 20 and the second conductor 220. In this instance, the position of the first arranging hole 91 does not correspond to that of the second arranging hole 92 because the first conductor 210 can be electrically connected to the second conductor 220 through the first arranging hole 91 and the second arranging hole 92 when the position of the first arranging hole 91 corresponds to that of the second arranging hole 92.

The first arranging hole 91 includes a first sealing arranging hole 20a formed into the sealing substrate 20, and a first conductive arranging hole 1a formed into the first conductor 210. The position of the first sealing arranging hole 20a can correspond to that of the first conductive arranging hole 1a. The second arranging hole 92 includes a second sealing arranging hole 20b formed into the sealing substrate 20, and a second conductive arranging hole 2b formed into the second conductor 220. The position of the second sealing arranging hole 20b can correspond to that of the second conductive arranging hole 2b.

Accordingly, the arranging members 91 and 92 are used to arrange (e.g., attach, fix, or align) the thin sealing substrate 20 (that is soft, flexible, and/or easily wrinkled), the first conductor 210, and the second conductor 220 with each other. The sealing substrate 20 and the first conductor 210 can be arranged with each other by matching the positions of the first sealing arranging hole 20*a* and the first conductive arranging hole 1*a*; and the sealing substrate 20 and the second conductor 220 can be arranged with each other by matching the positions of the second sealing arranging hole 20*b* and the second conductive arranging hole 2*b*.

To acquire precision (e.g., precision of arrangement and/or alignment) within 200 μm, at least four of the first sealing arranging holes 20*a*, at least four of the first conductive arranging holes 1*a*, at least four of the second sealing arranging holes 20*b*, and at least four of the second conductive arranging holes 2*b* can be formed.

Figure 6:
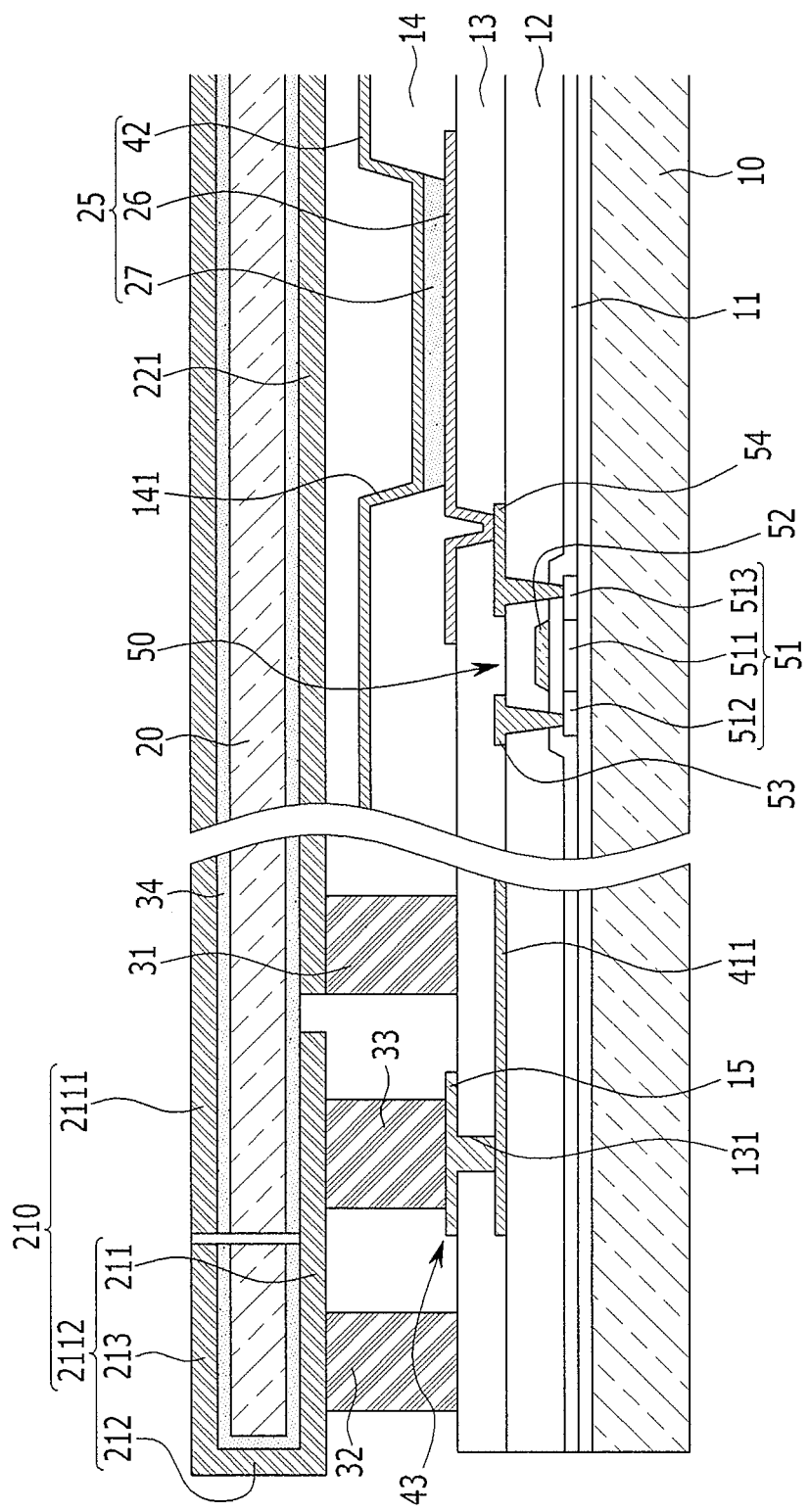
FIG. 6 through FIG. 8 show partially magnified cross-sectional views of an organic light emitting diode (OLED) display according to a first exemplary embodiment.
Figure 7:
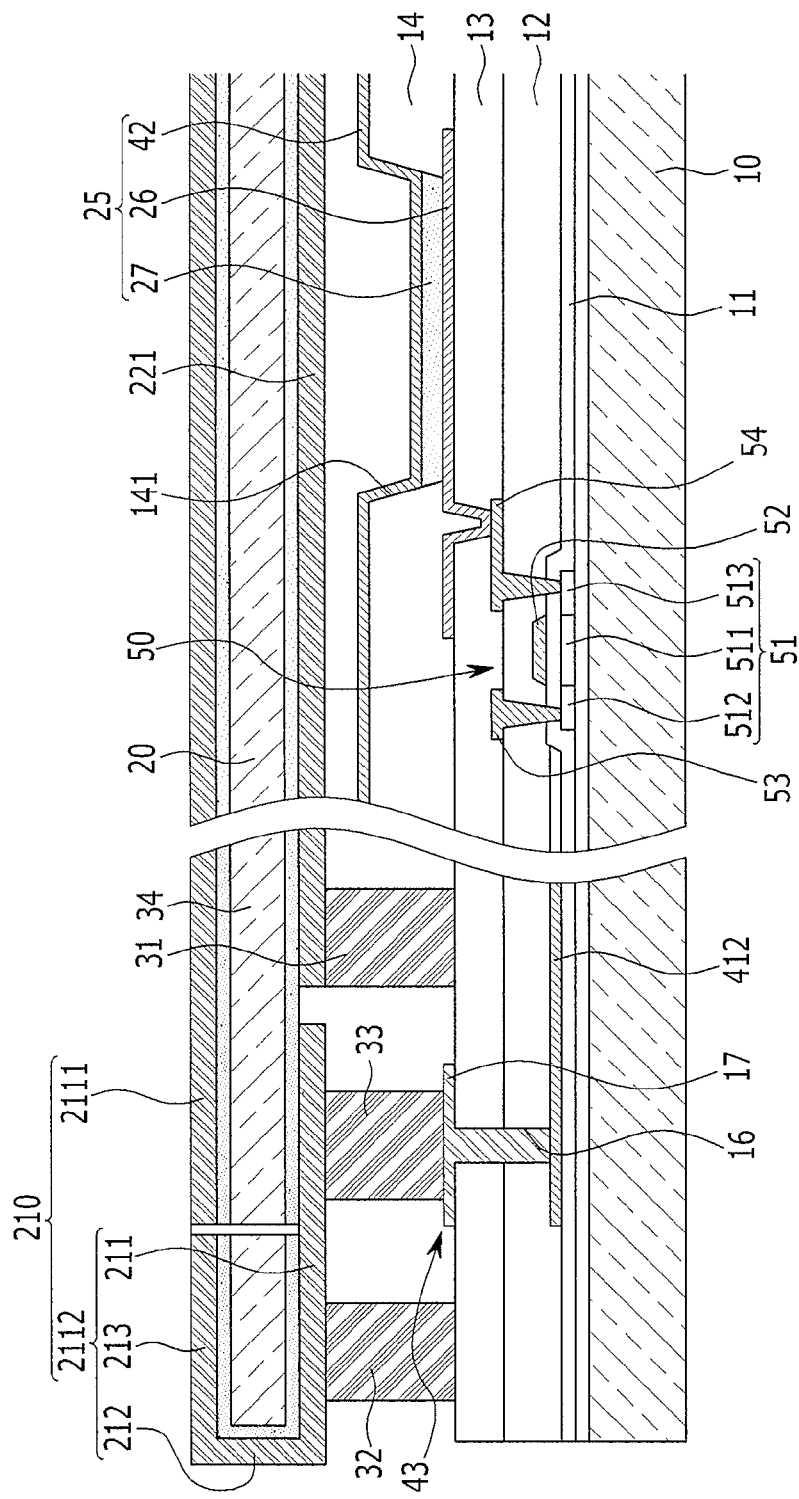
Figure 8:
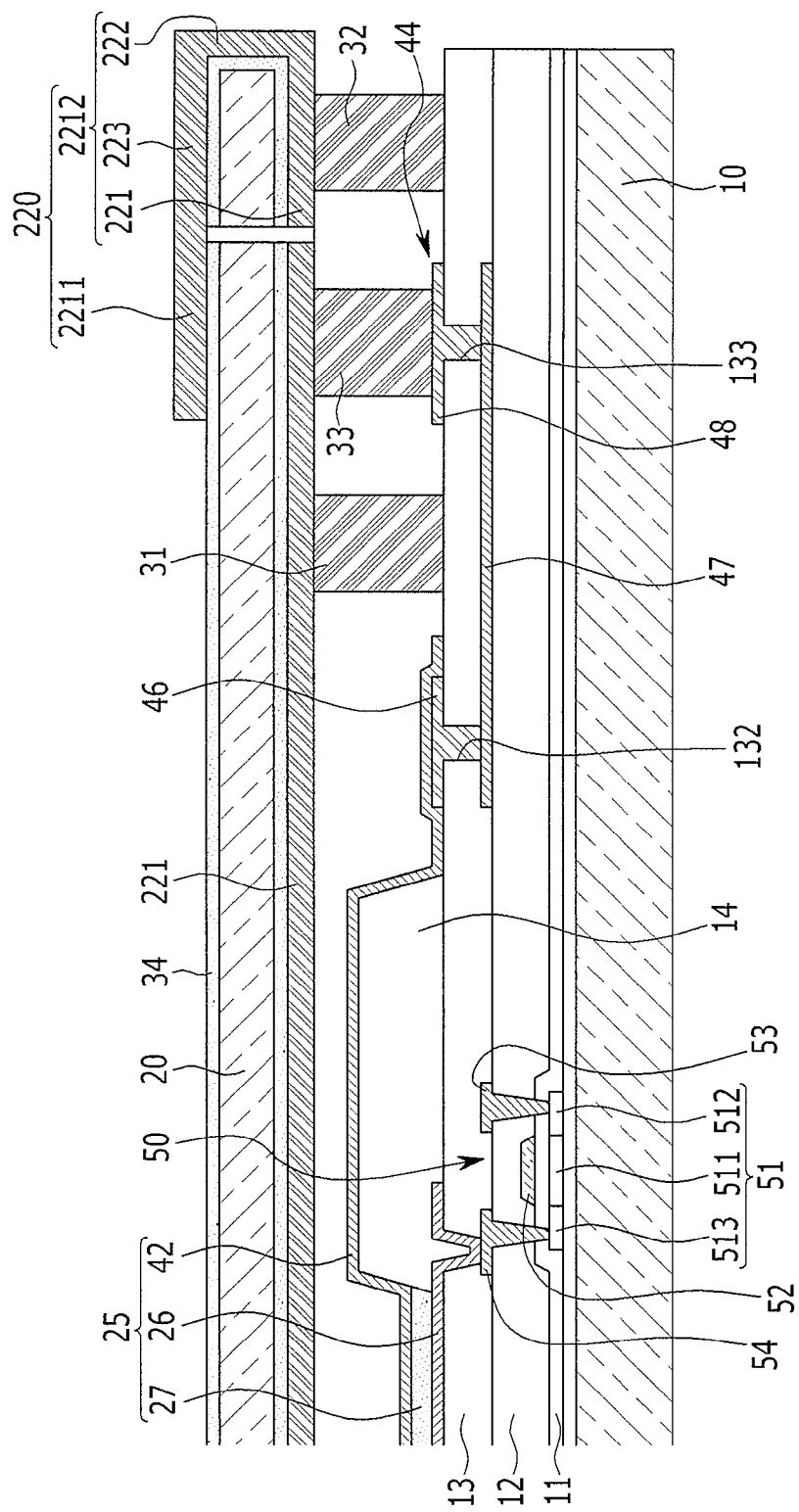

FIG. 6 through FIG. 8 show partially magnified cross-sectional views of an organic light emitting diode (OLED) display according to a first exemplary embodiment. FIG. 6 illustrates the first common power line and the first pad in more detail, and FIG. 7 illustrates the second common power line and the first pad in more detail. FIG. 8 illustrates the common electrode and the second pad in more detail.

Referring to FIG. 6 through FIG. 8, an organic light emitting element 25 and a driving circuit are formed for each pixel in the display area A10 as described. The driving circuit includes at least two thin film transistors and at least one capacitor. FIG. 6 through FIG. 8 show that one thin film transistor 50 and one organic light emitting element 25 are provided in the display area A10.

The thin film transistor 50 includes a semiconductor layer 51, a gate electrode 52, a source electrode 53, and a drain electrode 54. The semiconductor layer 51 is made of a polysilicon layer and includes a channel region 511, a source region 512, and a drain region 513. The channel region 511 is an impurity-non-doped intrinsic semiconductor, and the source region 512 and the drain region 513 are impurity-doped impurity semiconductors.

The gate electrode 52 is provided in the channel region 511 of the semiconductor layer 51 with a gate insulating layer 11 therebetween. The source electrode 53 and the drain electrode 54 are provided on the gate electrode 52 with an interlayer insulating layer 12 therebetween, and are connected to the source region 512 and drain region 513 through a contact hole formed in the interlayer insulating layer 12. A planarization layer 13 is formed on the source electrode 53 and the drain electrode 54, and a pixel electrode 26 is provided in the planarization layer 13. The pixel electrode 26 is connected to the drain electrode 54 through the contact hole of the planarization layer 13.

A pixel defining layer 14 is provided on the pixel electrode 26 and the planarization layer 13. The pixel defining layer 14 has a first opening 141 for each pixel to partially expose the pixel electrode 26. An organic emission layer 27 is formed on the exposed pixel electrode 26, and a common electrode 42 is formed over the display area A10 to cover the organic emission layer 27 and the pixel defining layer 14. The pixel electrode 26, the organic emission layer 27, and the common electrode 42 are configured into an organic light emitting element 25.

The pixel electrode 26 can be a hole injection electrode, and the common electrode 42 can be an electron injection electrode. In this case, the organic emission layer 27 is configured by a hole injection layer (HIL), a hole transport layer (HTL), an emission layer, an electron transport layer (ETL), and an electron injection layer (EIL) that are sequentially stacked from the pixel electrode 26. Holes and electrons are injected to the organic emission layer 27 by both the pixel electrode 26 and the common electrode 42, and light emits when excitons (a combination of the injected holes and electrons) are switched to the ground state from the exited state.

The pixel electrode 26 is formed with a transflective conductive layer, and the common electrode 42 is formed with a reflective conductive layer. The light output by the organic emission layer 27 is reflected by the common electrode 42 and is provided to the outside through the substrate 10. The above-noted light emitting structure is called a rear light emitting type. The pixel electrode 26 can be formed with triple layers of ITO/silver (Ag)/ITO, and the common electrode 42 can include one of silver (Ag), aluminum (Al), a silver alloy, and an aluminum alloy.

A first common power line 411 and a second common power line 412 can be formed in the same layer as one of the gate electrode 52 and the source/drain electrodes 53 and 54. FIG. 6 shows the case in which the first common power line 411 is formed in the same layer as the source/drain electrodes 53 and 54 with the same material, and FIG. 7 shows the case in which the second common power line 412 is formed in the same layer as the gate electrode 52 with the same material.

Referring to FIG. 6 and FIG. 7, ends of the first common power line 411 and the second common power line 412 are extended to the wire and sealing region A20 outside the display area A10. At least one of the four insulating layers formed in the display area A10 can be extended to the wire and sealing region A20. The end of the first common power line 411 can be covered with the planarization layer 13, and the end of the second common power line 412 can be covered with the interlayer insulating layer 12 and the planarization layer 13.

The planarization layer 13 has a second opening 131 to expose the end of the first common power line 411; and the first pad conductive layer 15 is formed on the planarization layer 13 and is electrically connected to the first common power line 411 through the second opening 131. The first pad 43 provided on the long side of the substrate 10 can be defined to be a first pad conductive layer 15.

The interlayer insulating layer 12 and the planarization layer 13 have a third opening 16 to expose an end of the second common power line 412; and a second pad conductive layer 17 is formed on the planarization layer 13 and is electrically connected to the second common power line 412 through the third opening 16. The first pad 43 provided on the short side of the substrate 10 can be defined to be the second pad conductive layer 17.

The first pad conductive layer 15 and the second pad conductive layer 17 can be formed in the same layer as the pixel electrode 26 with the same material as the pixel electrode 26. Hence, an additional patterning process for forming the first and second pad conductive layers 15 and 17 can be omitted, thereby simplifying the manufacturing process.

Referring to FIG. 8, the common electrode 42 is provided on the inner part of the first junction layer 31, and the second pad 44 is formed over the inner part defined by the second junction layer 32 and the outer part defined by the first junction layer 31 in order to make the common electrode 42 and the conductive junction layer 33 conductive.

The second pad 44 includes a third pad conductive layer 46, a fourth pad conductive layer 47, and a fifth pad conductive layer 48. The third pad conductive layer 46 is provided on the inner part defined by the first junction layer 31 and contacts the common electrode 42. The fourth pad conductive layer 47 is connected to the third pad conductive layer 46 through the fourth opening 132 of the planarization layer 13, and is provided over the inner part and the outer part defined by the first junction layer 31. The fifth pad conductive layer 48 is provided between the conductive junction layer 33 and the planarization layer 13, and is connected to the fourth pad conductive layer 47 through a fifth opening 133 of the planarization layer 13.

The third pad conductive layer 46 and the fifth pad conductive layer 48 are formed in the same layer as the pixel electrode 26 with the same material as the pixel electrode 26. The fourth pad conductive layer 47 can be formed in the same layer as one of the gate electrodes 52 and the source/drain electrodes 53 and 54 with the same material. Therefore, an additional patterning process for forming the second pad 44 can be omitted, thereby simplifying the manufacturing process.

FIG. 8 shows the case in which the fourth pad conductive layer 47 is formed in the same layer as the source/drain electrodes 53 and 54. However, the detailed configuration of the second pad 44 is not restricted to the embodiment, and any configuration enabling the common electrode 42 of the display area A10 and the conductive junction layer 33 of the wire and sealing region A20, to be conductive, is applicable.

Accordingly, the organic light emitting diode (OLED) display 100 can apply a uniform electric signal to the common power line 41 and the common electrode 42 in the four (up, down, right, and left) directions of the display area A10 without forming the pad region A30 on the four edges of the substrate 10. As a result, the organic light emitting diode (OLED) display 100 realizes a wide screen, increases luminance uniformity of the screen, and reduces the number of components to simplify the entire configuration and manufacturing process and thereby reduce the production cost.

In the described organic light emitting diode (OLED) display 100, the substrate 10 can be manufactured with transparent glass or a transparent polymer resin. The substrate 10 of a transparent polymer resin material includes polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and/or cellulose acetate propionate (CAP).

A plurality of processes for forming a plurality of pixels on the substrate 10 are progressed, and heat is applied during the processes, so the substrate 10 is expanded by the heat. The expansion of the substrate 10 worsens the durability of the organic light emitting diode (OLED) display 100 and the precision of the display area A10, so a material with a low thermal expansion coefficient needs to be selected for the material of the substrate 10. In one embodiment, the substrate 10 manufactured with the glass or the polymer resin has a thermal expansion coefficient from $3\times10^{-6}$/K to $4\times10^{-6}$/K (or from about $3\times10^{-6}$/K to about $4\times10^{-6}$/K).

A method for manufacturing an organic light emitting diode (OLED) display, according to an exemplary embodiment, will now be described with reference to FIG. 9 through FIG. 13.

FIG. 9 through FIG. 13 sequentially show a method for manufacturing an organic light emitting diode (OLED) display according to an exemplary embodiment.

Figure 9:
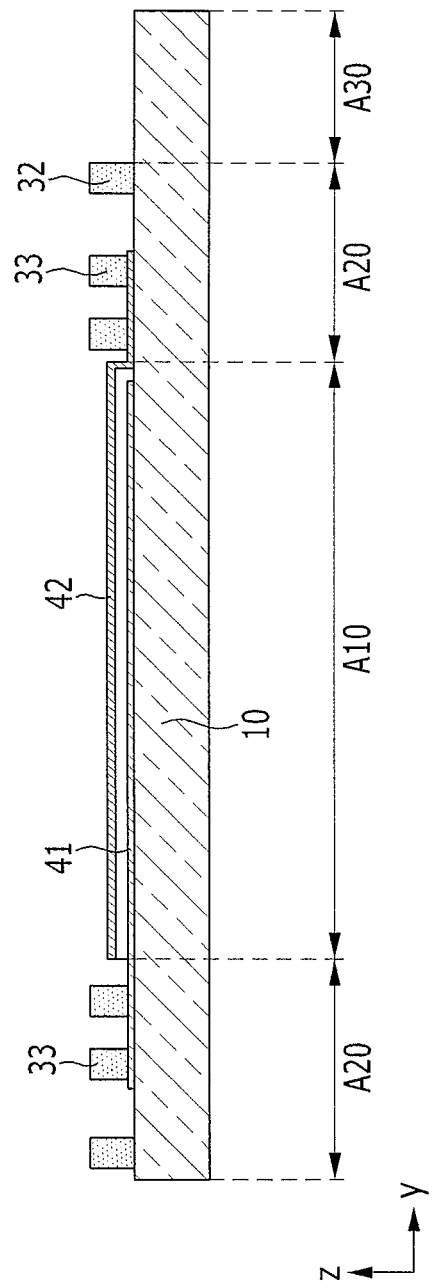
FIG. 9 through FIG. 13 sequentially show a method for manufacturing an organic light emitting diode (OLED) display according to an exemplary embodiment.

As shown in FIG. 9, a display device 40, including a common power line 41 and a common electrode 42, is formed on the substrate 10. A first junction layer 31 surrounding the display device 40 and a second junction layer 32 provided on the outer part defined by the first junction layer 31, are formed. A conductive junction layer 33 is formed between the first junction layer 31 and the second junction layer 32.

Figure 10:
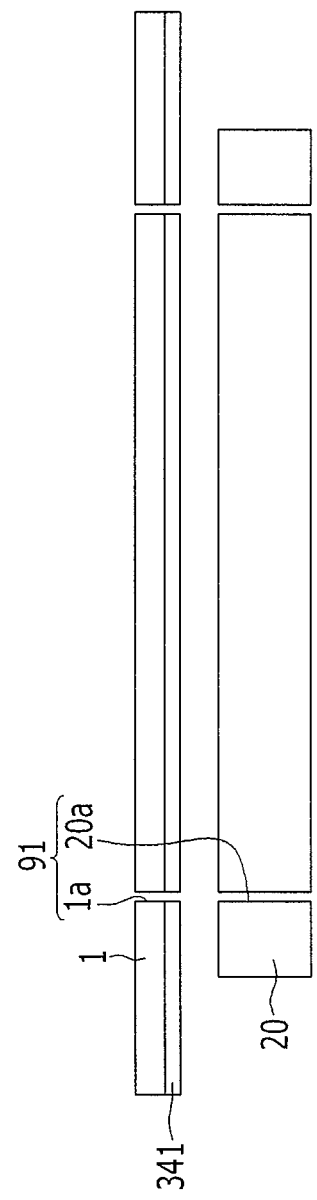

Next, as shown in FIG. 10, a first conductive plate 1 is positioned on the sealing substrate 20. A plurality of first arranging holes 91 (see FIG. 11) are formed into the same positions of the sealing substrate 20 and the first conductive plate 1. The first arranging holes 91 include a first sealing arranging hole 20a formed into the sealing substrate 20 and a first conductive arranging hole 1a formed into the first conductor plate 1.

Figure 11:
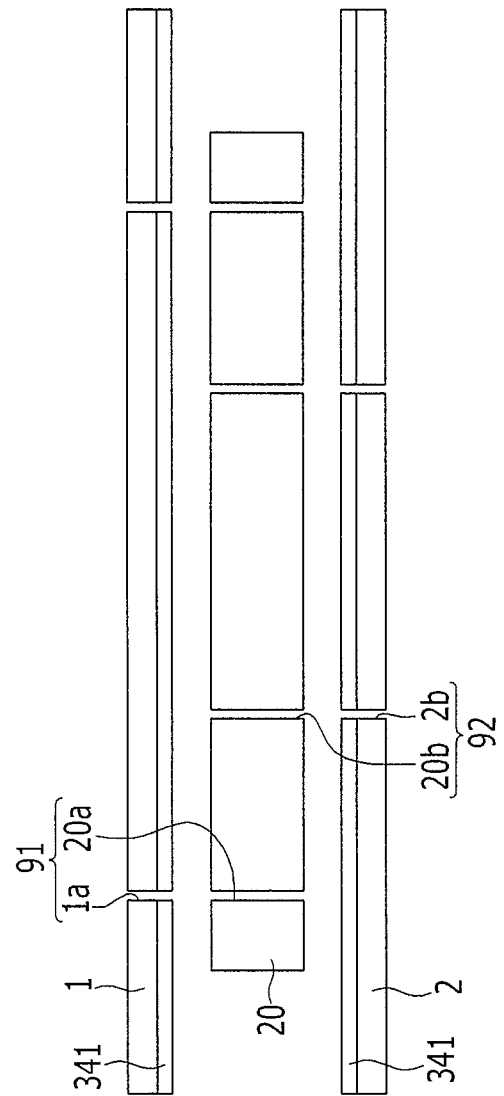

Referring to FIG. 11, a second conductive plate 2 is positioned below the sealing substrate 20, and a plurality of second arranging holes 92 are formed into the same positions of the sealing substrate 20 and the second conductive plate 2. The second arranging holes 92 include a second sealing arranging hole 20b formed into the sealing substrate 20 and a second conductive arranging hole 2b formed into the second conductor plate 2.

The first conductive plate 1 and the second conductive plate 2 can be formed with an aluminum layer, an aluminum alloy layer, a copper layer, or a copper alloy layer. The first conductive plate 1 and the second conductive plate 2 can be easily-folded metal foils with excellent flexibility such as an aluminum foil or a copper foil. An insulating adhesive 341, for adhering the first conductive plate 1 and the second conductive plate 2 to the sealing substrate 20, is formed on the first conductive plate 1 and the second conductive plate 2.

Figure 12:
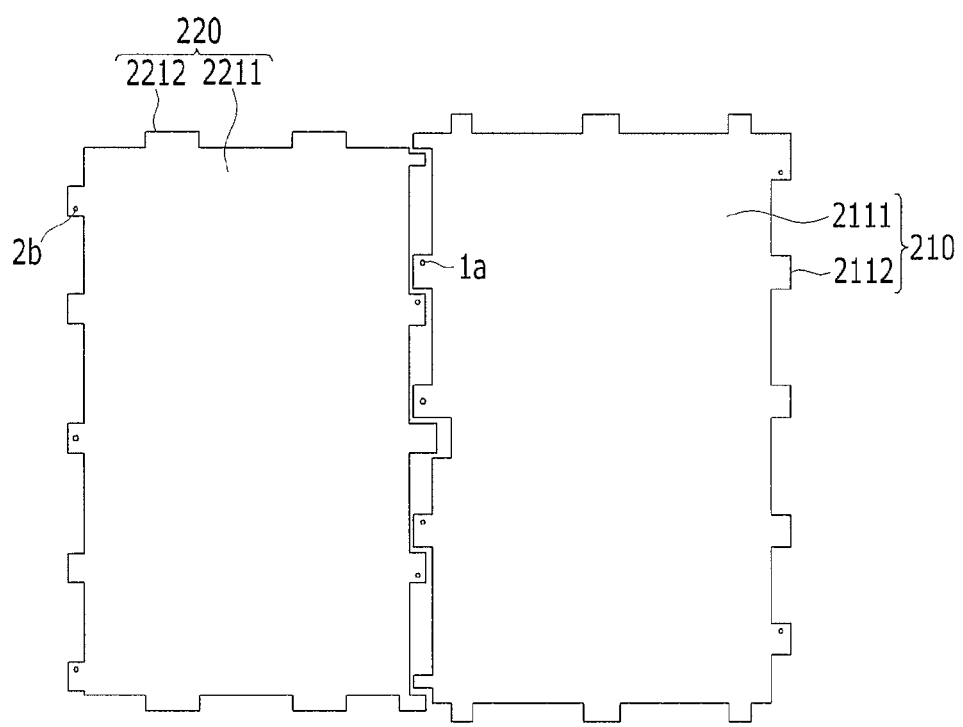

As shown in FIG. 12, the first conductive plate 1 is cut (formed) into a first conductor 210 including a first center 2111 and a first branch 2112. The second conductive plate 2 is cut (formed) into a second conductor 220 including a second center 2211 and a second branch 2212. In this instance, the first conductive plate 1 and the second conductive plate 2 can be cut by using a punch.

Figure 13:
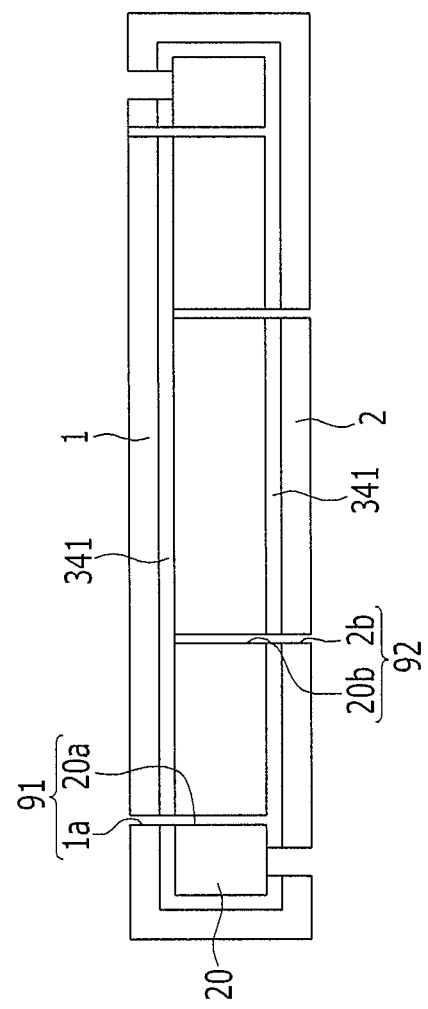

As shown in FIG. 13, the first conductor 210 is attached to the outer side of the sealing substrate 20 with reference to the first arranging hole 91. That is, the sealing substrate 20 and the first conductor 210 are arranged by matching the first sealing arranging hole 20a and the first conductive arranging hole 1a, and the first conductor 210 is attached to the outer side of the sealing substrate 20. The first branch 2112 is folded and is attached over the lateral side and the inner side of the sealing substrate 20. Therefore, the first branch 2112 connects the first conductor 210 that is attached to the outer side of the sealing substrate 20 to the inner side of the sealing substrate 20.

The second conductor 220 is attached to the inner side of the sealing substrate 20 with reference to the second arranging hole 92. That is, the sealing substrate 20 and the second conductor 220 are arranged by matching the second sealing arranging hole 20b and the second conductive arranging hole 2b, and the second conductor 220 is attached to the outer side of the sealing substrate 20. The second branch 2212 is folded to be attached to the lateral side and the outer side of the sealing substrate 20. Therefore, the second branch 2212 connects the second conductor 220 that is attached to the inner side of the sealing substrate 20 to the outer side of the sealing substrate 20.

The insulating adhesive 341 is hardened so that the first conductor 210 and the second conductor 220 may be completely attached to the sealing substrate 20.

Therefore, the first outer layer 213 is connected to the first inner layer 211 by folding the first branch 2112 and using the first connecting layer 212; and the second outer layer 223 is connected to the second inner layer 221 by folding the second branch 2212 and using the second connecting layer 222. These connections are made without forming the via hole for connecting the first outer layer 213 formed on the outer side of the sealing substrate 20 and the first inner layer 211 formed on the inner side of the sealing substrate 20; or the via hole for connecting the second outer layer 223 formed on the outer side of the sealing substrate 20 and the second inner layer 221 formed on the inner side of the sealing substrate 20. Hence, the manufacturing processes for forming the via hole, such as hole drilling, plugging, plating, or sanding are not needed, thereby reducing the production cost and the manufacturing process. Also, the first outer layer 213 is connected to the first inner layer 211, and the second outer layer 223 is connected to the second inner layer 221 without forming the via hole, so it is applicable to a wide organic light emitting diode (OLED) display.

Further, the first conductor 210 and the second conductor 220 are arranged without additional cost or devices by forming the first arranging hole 91 and the second arranging hole 92 into the sealing substrate 20, the first conductor 210, and the second conductor 220.

As shown in FIG. 1, the sealing substrate 20 (to which the first conductor 210 and the second conductor 220 are attached) is attached to the substrate 10 in order to seal the substrate 10.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
    a substrate;
    a display device on the substrate, and comprising a common power line and a common electrode;
    a sealing substrate attached to the substrate by a junction layer surrounding the display device, the sealing substrate sealing the display device with the substrate;
    a first conductor formed over an outer side, a lateral side, and an inner side of the sealing substrate, the first conductor being for supplying a first electrical signal to the common power line;
    a second conductor formed on the inner side, the lateral side, and the outer side of the sealing substrate, the second conductor being for supplying a second electrical signal to the common electrode; and
    a plurality of arranging members formed into the sealing substrate, the first conductor, and the second conductor, the arranging members being for arranging positions of the sealing substrate, the first conductor, and the second conductor.

2. The organic light emitting diode display of claim 1, wherein the first conductor comprises
    a first center formed in the center of the outer side of the sealing substrate, and
    a plurality of first branches extended from the first center and formed over the lateral side and the inner side of the sealing substrate.

3. The organic light emitting diode display of claim 2, wherein the second conductor comprises
    a second center formed in the center of the inner side of the sealing substrate, and
    a plurality of second branches extended from the second center and formed on the lateral side and the outer side of the sealing substrate.

4. The organic light emitting diode display of claim 3, wherein the first branches and the second branches are alternately disposed.

5. The organic light emitting diode display of claim 3, wherein the first branches are separated from the second branches.

6. The organic light emitting diode display of claim 5, wherein the first conductor and the second conductor are formed by an aluminum layer, an aluminum alloy layer, a copper layer, or a copper alloy layer.

7. The organic light emitting diode display of claim 3, wherein
    the arranging members comprise:
        a first arranging hole for arranging positions of the sealing substrate and the first conductor; and
        a second arranging hole for arranging positions of the sealing substrate and the second conductor, and
    the position of the first arranging hole does not correspond to the position of the second arranging hole.

8. The organic light emitting diode display of claim 7, wherein
    the first arranging hole comprises:
        a first sealing arranging hole formed into the sealing substrate; and
        a first conductive arranging hole formed into the first conductor, and
    the position of the first sealing arranging hole corresponds to the position of the first conductive arranging hole.

9. The organic light emitting diode display of claim 8, wherein
    the second arranging hole comprises:
        a second sealing arranging hole formed into the sealing substrate; and
        a second conductive arranging hole formed into the second conductor, and
    the position of the second sealing arranging hole corresponds to the position of the second conductive arranging hole.

10. The organic light emitting diode display of claim 8, wherein
    the first conductive arranging hole is formed into one of the first branches of the first conductor, and
    the second conductive arranging hole is formed into one of the second branches of the second conductor.

11. The organic light emitting diode display of claim 1, wherein
    the sealing substrate is made of a polymer and/or a glass fiber, and the thickness of the sealing substrate is equal to or greater than 50 μm and equal to or less than 100 μm.

12. The organic light emitting diode display of claim 1, wherein
    the sealing substrate is made of a resin matrix and a plurality of carbon fibers, and
    the thickness of the sealing substrate is equal to or greater than 100 μm and equal to or less than 200 μm.

13. The organic light emitting diode display of claim 12, further comprising:
    an insulating layer formed on the inner side, the outer side, and the lateral side of the sealing substrate, wherein
    the first conductor and the second conductor are provided on the insulating layer.

14. The organic light emitting diode display of claim 1, further comprising:
    an insulating layer formed on the sealing substrate, wherein:
    the first conductor comprises a first center formed in the center of the outer side of the sealing substrate, and a first branch extended from the first center and formed over the lateral side and the inner side of the sealing substrate;

the second conductor comprises a second center formed in the center of the inner side of the sealing substrate, and a second branch extended from the second center and formed on the lateral side and the outer side of sealing substrate; and the insulating layer formed on positions, corresponding to the first branch and the second branch, is wider than the first branch and the second branch.

15. The organic light emitting diode display of claim 1, wherein the sealing substrate is made of a resin matrix and carbon fibers, and the thickness of the sealing substrate is equal to or greater than 200 μm and equal to or less than 2 mm.

16. A method for manufacturing an organic light emitting diode display, the method comprising:

forming a display device comprising a common power line and a common electrode on a substrate;

forming a first conductor for supplying a first electrical signal to the common power line and a second conductor for supplying a second electrical signal to the common electrode onto a sealing substrate for sealing the display device with the substrate; and sealing the substrate by attaching the sealing substrate to the substrate, wherein the forming of the first conductor and the second conductor comprises:

providing a first conductive plate on the sealing substrate, and forming a first arranging hole on the same position as the sealing substrate and the first conductive plate;

providing a second conductive plate below the sealing substrate, and forming a second arranging hole on the same position of the sealing substrate and the second conductive plate;

cutting the first conductive plate into a first conductor including a first center and a first branch, and cutting the second conductive plate into a second conductor including a second center and a second branch;

attaching the first conductor to an outer side of the sealing substrate with reference to the first arranging hole, and folding the first branch to attach it to a lateral side and an inner side of the sealing substrate; and attaching the second conductor to the inner side of the sealing substrate with reference to the second arranging hole, and folding the second branch to attach it to the lateral side and the outer side of the sealing substrate.

17. The method of claim 16, wherein the position of the first arranging hole does not correspond to the position of the second arranging hole.

18. The method of claim 17, wherein the first branch and the second branch are alternately disposed.

* * * * *